United States Patent [19]
Jeng et al.

[11] Patent Number: 5,741,624
[45] Date of Patent: Apr. 21, 1998

[54] METHOD FOR REDUCING PHOTOLITHOGRAPHIC STEPS IN A SEMICONDUCTOR INTERCONNECT PROCESS

[75] Inventors: Nanseng Jeng; Christophe Pierrat, both of Boise, Id.

[73] Assignee: Micron Technology, Inc., Boise, Id.

[21] Appl. No.: 600,587

[22] Filed: Feb. 13, 1996

[51] Int. Cl.[6] .................................. G03F 7/20; G03F 7/26
[52] U.S. Cl. ........................... 430/312; 430/314; 430/317
[58] Field of Search ................................. 430/5, 311, 312, 430/313, 314, 316, 317, 323, 324, 396

[56] References Cited

U.S. PATENT DOCUMENTS

| | | | |
|---|---|---|---|
| 4,985,374 | 1/1991 | Tsuji | 437/229 |
| 5,139,922 | 8/1992 | Watanabe et al. | 430/296 |
| 5,244,759 | 9/1993 | Pierrat | 430/5 |
| 5,275,896 | 1/1994 | Garofalo et al. | 430/5 |
| 5,286,581 | 2/1994 | Lee | 430/5 |
| 5,308,741 | 5/1994 | Kemp | 430/312 |
| 5,338,626 | 8/1994 | Garofalo et al. | 430/5 |
| 5,407,785 | 4/1995 | Leroux | 430/312 |
| 5,411,823 | 5/1995 | Okamoto | 430/5 |
| 5,418,095 | 5/1995 | Vasudev et al. | 430/5 |
| 5,422,205 | 6/1995 | Inoue et al. | 430/5 |
| 5,424,154 | 6/1995 | Borodovsky | 430/5 |
| 5,429,896 | 7/1995 | Hasegawa et al. | 430/5 |
| 5,429,897 | 7/1995 | Yoshioka et al. | 430/5 |
| 5,455,131 | 10/1995 | Kang et al. | 430/5 |
| 5,472,814 | 12/1995 | Lin | 430/5 |

Primary Examiner—Kathleen Duda
Attorney, Agent, or Firm—Steven P. Koda

[57] ABSTRACT

A semiconductor wafer having a first layer and overlying insulating layer receives a photoresist layer. A first photoresist area is exposed to light having a first dosage, while a second, adjacent photoresist area is concurrently exposed to light having a second dosage. The first area and second area then are concurrently developed to partially expose the photoresist layer. The partial exposure removes photoresist within the first area to one depth and within the second area to a second depth. The second depth differs from the first depth. In one embodiment the second depth extends through the photoresist down to the insulating layer. After subsequently performing a contact and/or trench etch through the exposed insulating layer and removing excess photoresist above the insulating layer, conductive material is deposited in the contact/trench opening and over the insulating layer. The result is an upper conductive layer coupled to the first layer via a contact or other conductive connection.

11 Claims, 5 Drawing Sheets

5,741,624

METHOD FOR REDUCING PHOTOLITHOGRAPHIC STEPS IN A SEMICONDUCTOR INTERCONNECT PROCESS

BACKGROUND OF THE INVENTION

This invention relates to semiconductor processes for connecting one layer of a semiconductor wafer to another layer of a semiconductor wafer, and more particularly to a method for reducing the number of photolithographic steps in processes connecting one layer of a semiconductor wafer to an upper layer of the semiconductor wafer.

Semiconductor devices, also called integrated circuits, are mass produced by fabricating hundreds of identical circuit patterns on a single semiconductor wafer. During the process, the wafer is sawed into identical dies or "chips". Although commonly referred to as semiconductor devices, the devices are fabricated from various materials, including conductors (e.g., aluminum, tungsten), non-conductors (e.g., silicon dioxide) and semiconductors (e.g., silicon). Silicon is the most commonly used semiconductor, and is used in either its single crystal or polycrystalline form. Polycrystalline silicon is often referred to as polysilicon or simply "poly". The conductivity of the silicon is adjusted by adding impurities—a process commonly referred to as "doping".

Within an integrated circuit thousands of devices (e.g., transistors, diodes) are formed. Typically contacts are formed where a device interfaces to an area of doped silicon. Specifically, plugs typically are formed to connect metal 1 layers with device active regions. Vias typically are formed to connect metal 2 and metal 1 layers. Also interconnects typically are formed to serve as wiring lines interconnecting the many devices on the IC and the many regions within an individual device. These contacts and interconnects are formed using conductive materials.

The integrated circuit devices with their various conductive layers, semiconductive layers, insulating layers, contacts and interconnects are formed by fabrication processes, including doping processes, deposition processes, photolithographic processes, etching processes and other processes. The term "photolithographic process" is of significance here, and refers to a process in which a pattern is delineated in a layer of material (e.g., photoresist) sensitive to photons, electrons or ions. The principle is similar to that of a photocamera in which an object is imaged on a photo-sensitive emulsion film. While with a photo-camera the "final product" is the printed image, the image in the semiconductor process context typically is an intermediate pattern which defines regions where material is deposited or removed. The photolithographic process typically involves multiple exposing and developing steps, wherein at a given step the photoresist is exposed to photons, electrons or ions, then developed to remove one of either the exposed or unexposed portions of photoresist. Complex patterns typically require multiple exposure and development steps.

One ongoing goal of semiconductor design and fabrication is to reduce costs. Cost reduction is essential to ongoing success in the field. One manner of reducing costs is to eliminate or optimize steps in the semiconductor fabrication process. In doing so, it is important to maintain or improve device and process efficiency and effectiveness.

SUMMARY OF THE INVENTION

According to the invention, a reduced number of photolithographic steps are performed in a semiconductor process for connecting an upper conductive layer to another layer (e.g., conductive layer, semiconductive layer, insulating layer) of a semiconductor wafer. In particular a single exposure step and a single development step is performed on a resist layer (together one photolithographic step). In addition other steps, although not photolithographic steps, are performed to form a connection (e.g., contact, plug, via, interconnect) between the upper conductive layer and the lower layer.

According to one aspect of the invention, a photoresist layer on a semiconductor wafer is partially exposed and developed to remove photoresist down to one depth within a first area and down to a second depth within a second area. To do so the photoresist first area is exposed to light having a first dosage, while the photoresist second area is exposed to light having a second dosage. The second dosage differs from the first dosage. Such first and second areas are concurrently exposed in the same process step. The first area and second area then are concurrently developed to partially expose the photoresist layer. In particular, the partial exposure removes photoresist within the first area to one depth and removes photoresist within the second area to a second depth. In one embodiment the second dosage is greater than the first dosage and correspondingly, the second depth is greater than the first depth.

According to another aspect of the invention, a mask having different transmissivities at different areas of the mask is used. At areas directing light to the first photoresist area, the mask area has one transmissivity. At areas directing light to the second photoresist area, the mask area has a different transmissivity. The mask transmits light at the first dosage for exposing the first area and light at the second dosage for exposing the second area. In one embodiment the mask is a phase-shifting mask.

According to another aspect of the invention, a semiconductor wafer having a first layer and an overlying insulating layer receives the layer of photoresist over the insulating layer. A first area of the photoresist layer is exposed to light having a first dosage while a second area adjacent the first area is concurrently exposed to light having a second dosage differing from the first dosage. The first area and second area of the photoresist layer then are concurrently developed to remove photoresist within the first area to one depth and to remove all photoresist within the second area. The intermediate result is a first opening in the photoresist layer exposing a portion of the insulating layer. Thereafter a second opening is defined by etching through the exposed insulating layer within the first opening. Conductive material then is deposited within the second opening and above the first layer to form a contact or other conductive connection between the first layer and a deposited second layer. The second layer is a conductive layer above the first layer.

According to another aspect of the invention, the etching step includes etching the exposed insulating layer within the first opening to a first depth, and etching through the photoresist remaining in the first area and an underlying portion of the insulating layer down to a second depth in the insulating layer. The first depth is greater than the second depth.

According to another aspect of the invention, the first depth is less than the thickness of the insulating layer. Also, the step of etching to the first depth partially defines the second opening, and further includes after etching through the remaining photoresist, etching the insulating layer within the first opening through to the first layer to complete defining the second opening.

According to various embodiments, the first layer is one of a conductive, non-conductive or semiconductive layer and the second layer is a conductive layer.

One advantage of the invention is to reduce the number of photolithographic steps in a semiconductor fabrication process without compromising device efficiency or effectiveness. These and other aspects and advantages of the invention will be better understood by reference to the following detailed description taken in conjunction with the accompanying drawings.

DESCRIPTION OF SPECIFIC EMBODIMENTS

Overview

Figure 1:
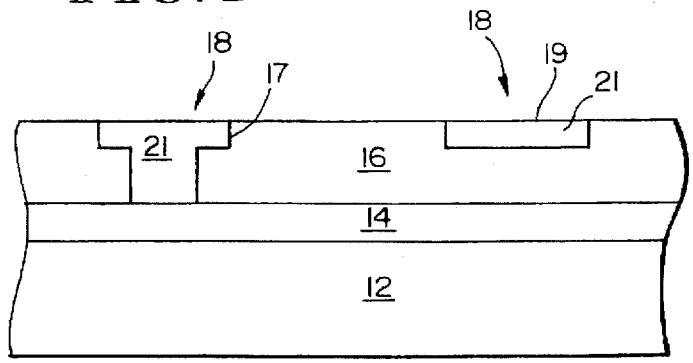
FIG. 1 is a partial cross section of a semiconductor wafer having a conductive region formed according to a method embodiment of this invention.

Among the many layers and wiring lines of an integrated circuit formed on a semiconductor wafer, there often is a need to provide a conductive connection between a lower layer and an upper layer. Exemplary connecting structures include contacts, vias and plugs. FIG. 1 shows a partial cross section of a semiconductor wafer 10. In the portion of the wafer 10 shown there is a semiconductor substrate 12, a first layer 14, and an insulating layer 16. In addition there is an upper conductive layer 18. In the embodiment shown the upper conductive layer 18 is a wiring line. The cross-section illustrated reveals two portions 17, 19 of the wiring line 18. Such portions 17, 19 are integrally formed as part of the same wiring line. A region 20 connects the first layer 14 to a portion 17 of the wiring line 18. In various embodiments the first layer 14 is a conductive region, a conductive layer, a doped semiconductor active region or a semiconductive layer. In a specific embodiment the first layer 14 is an active region of the semiconductor substrate 12. In another specific embodiment the first layer 14 and upper layer 18 are conductive layers and the conductive region 20 is a contact between the layers 14, 18. In alternative embodiments there are one or more other layers (not shown) between the substrate 12 and first layer 14, and one or more other layers (not shown) between the first layer 14 and the upper layer 18. The upper layer 18 and connection region 20 are formed with conductive material 21.

This invention is related to an efficient semiconductor process for forming the connection between the first layer 14 and upper conductive layer 18. In particular the connection is formed using only one photolithographic step, or more specifically one photolithographic exposure and one photolithographic development. Other steps such as etching, resist stripping, chemical-mechanical polishing (CMP) and deposition also are performed. A mask 42 is used in the photolithographic step.

Method Embodiment

Figure 2:
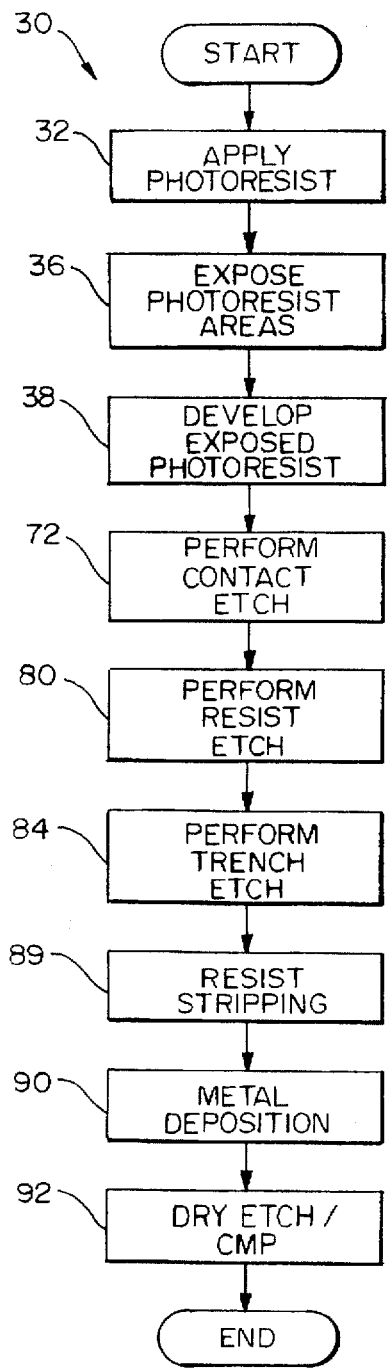
FIG. 2 is a flow chart of a semiconductor process for connecting one layer to an upper conductive layer via a contact or other conductive region according to an embodiment of this invention.
Figure 3:
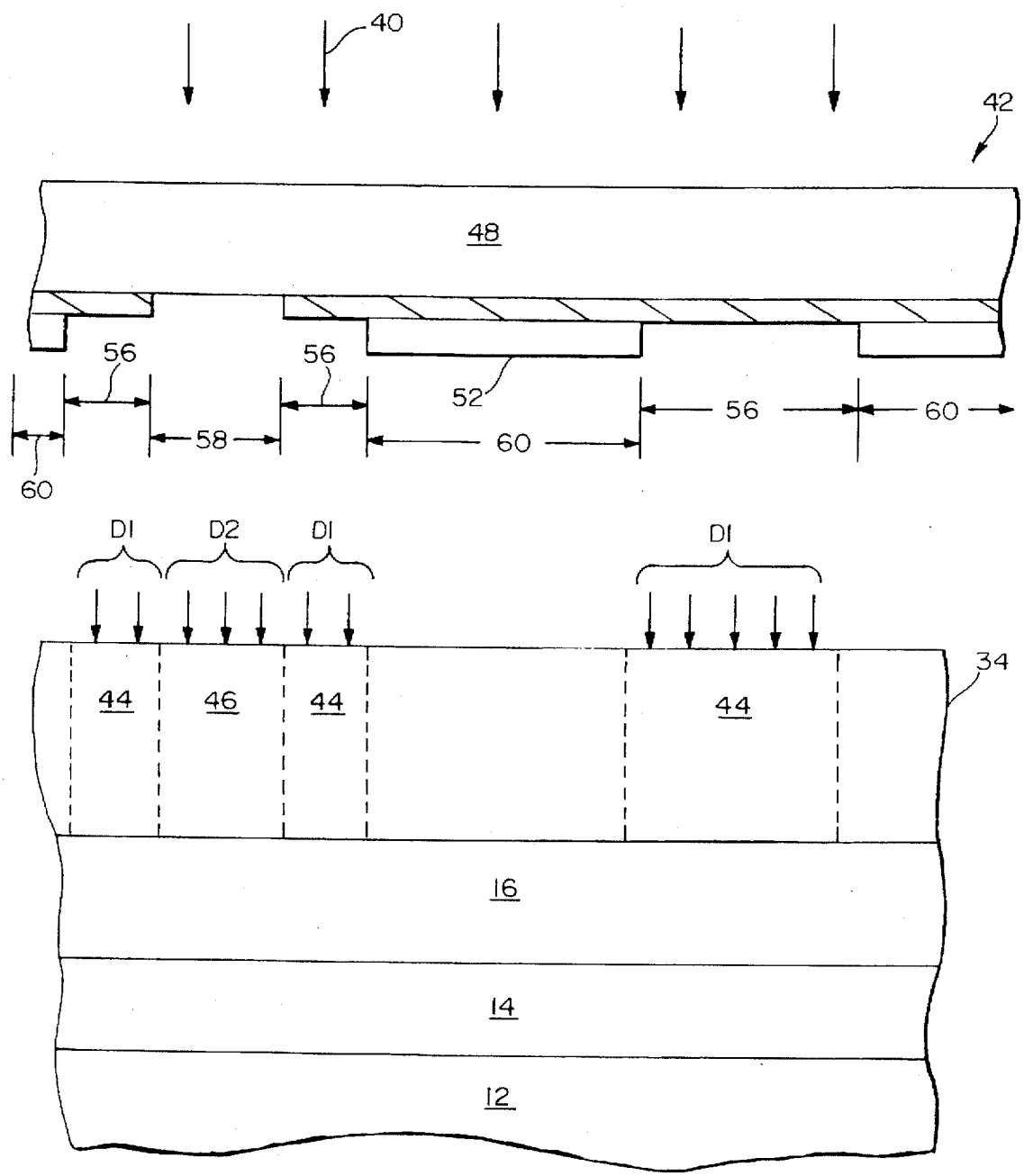
FIG. 3 is a cutaway view of a semiconductor wafer exposed to light through a phase-shifting mask during a photolithographic step according to one embodiment of the method of this invention.

FIG. 2 shows a flow chart of a semiconductor process 30 for fabricating an upper conductive layer 18 and a contact or other conductive connection 20 between a first layer 14 and the upper conductive layer 18. Referring to FIG. 3, a wafer includes a first layer 14 and an insulating layer 16. At step 32 a photoresist layer 34 is applied over the insulating layer 16. The photoresist layer 34 covers at least a portion of insulating layer 16 in the vicinity of where the conductive region 20 and upper layer 18 are eventually to be formed.

With the photoresist layer 34 in place, a photolithographic process is performed. At step 36 an exposure step is performed, followed by a development step 38. At step 36 a light source emits light 40 of a prescribed wavelength. A typical wavelength is between 248 nm and 436 nm, although shorter wavelengths down to 150 nm and longer wavelengths beyond 436 nm also are encompassed by this invention. Referring to FIG. 3, the light waves 40 travel through a mask 42 which emits light of differing dosage at different regions 56, 58, 60. As a result light at a first dosage D1 impinges upon one or more first areas 44 of the photoresist layer 34, while light at a second dosage D2 impinges upon one or more second areas 46 of the photoresist layer 34.

At step 36 the exposed regions 44, 46 are concurrently developed to partially remove photoresist 34. The development step 36 causes photoresist 34 to be removed down to a first depth 62 within the first areas 44 and down to a second depth 64 within the second area(s) 46. Preferably the dosage D1 does not equal dosage D2. For an embodiment in which the dosage D2>D1, the second depth 64 is greater than the first depth 62.

Figure 4:
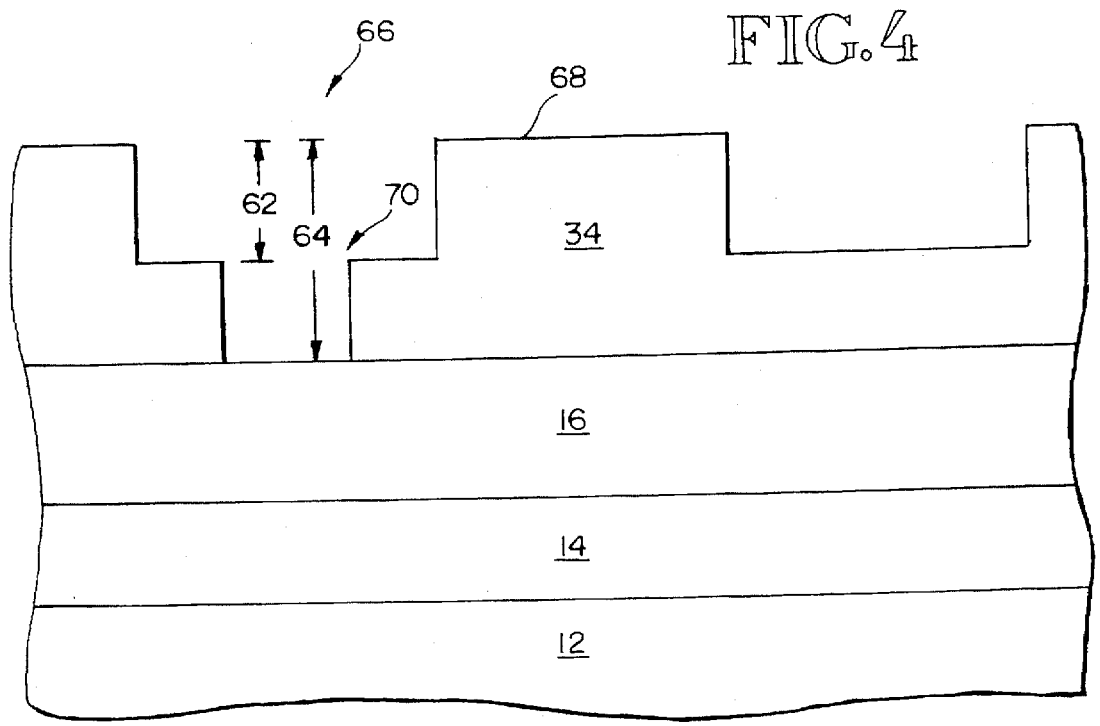
FIG. 4 is a cutaway view of the semiconductor wafer of FIG. 3 after a resist development step is performed according to an embodiment of this invention.

In the embodiment shown in FIG. 4, the second depth 64 is entirely through the photoresist layer 34 exposing the underlying insulating layer 16. Also in the embodiment (see FIG. 3) shown there are two first areas 44 surrounding a second area 46. Once developed, there is an opening 66 at an upper surface 68 of the photoresist layer 34 (see FIG. 4). Within the opening 66 there is a narrower opening 70 extending through the photoresist layer 34 down to the insulating layer 16.

Figure 5:
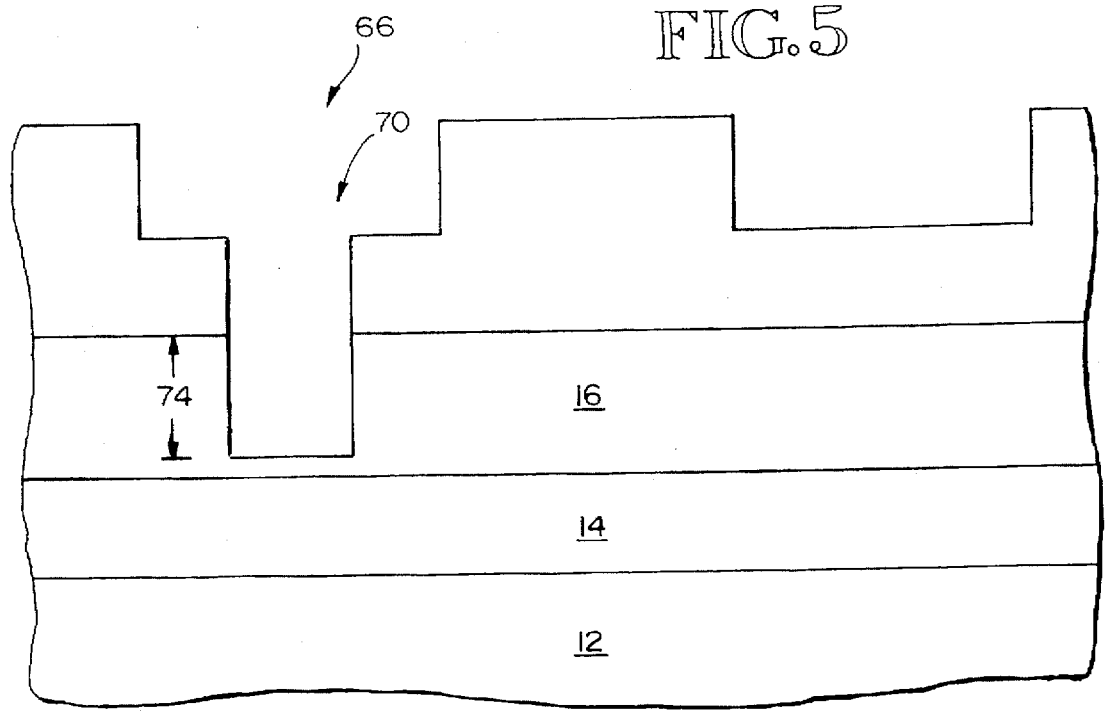
FIG. 5 is a cutaway view of the semiconductor wafer of FIG. 4 after a contact etching step is performed according to an embodiment of this invention.

Referring to FIGS. 2 and 5, at step 72 a contact etch is performed within the opening 70 to etch away the exposed insulating material within opening 70 down to a depth 74. In one embodiment the etch is to a depth all the way through the insulating layer to the first layer 14. In the embodiment illustrated, the etch is to a depth near the first layer 14. For example, for a 10,000 Å, insulating layer 16, the etch extends approximately 7000 Å, leaving a thin layer of approximately 3000 Å, of insulating material remaining.

Figure 6:
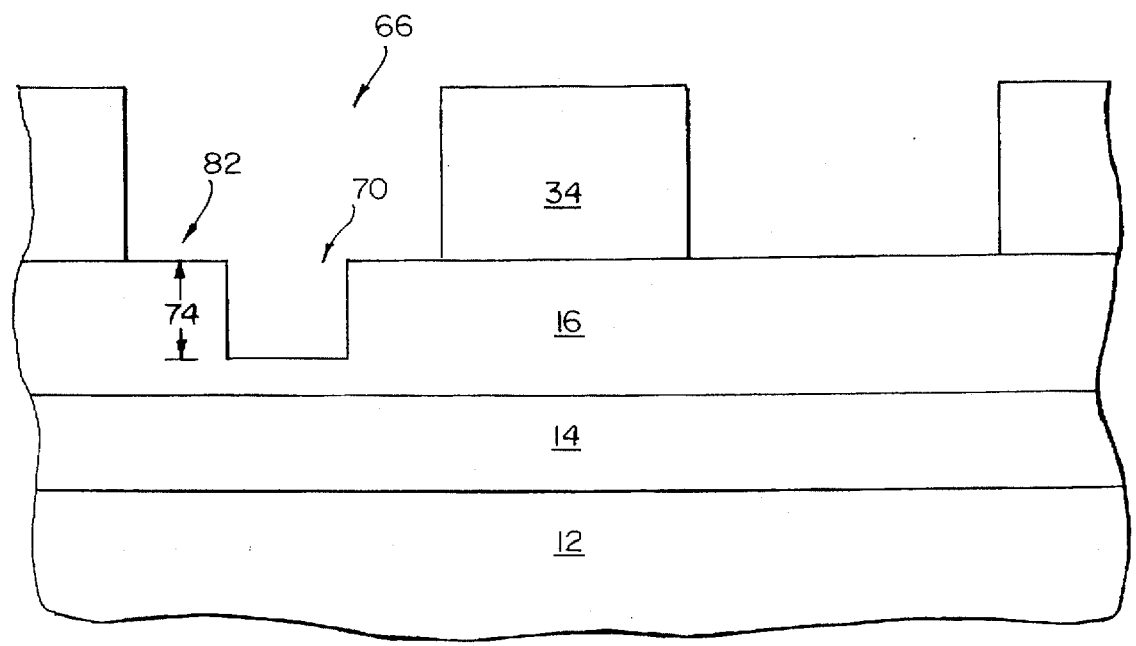
FIG. 6 is a cutaway view of the semiconductor wafer of FIG. 5 after a photoresist etching step is performed according to an embodiment of this invention.
Figure 7:
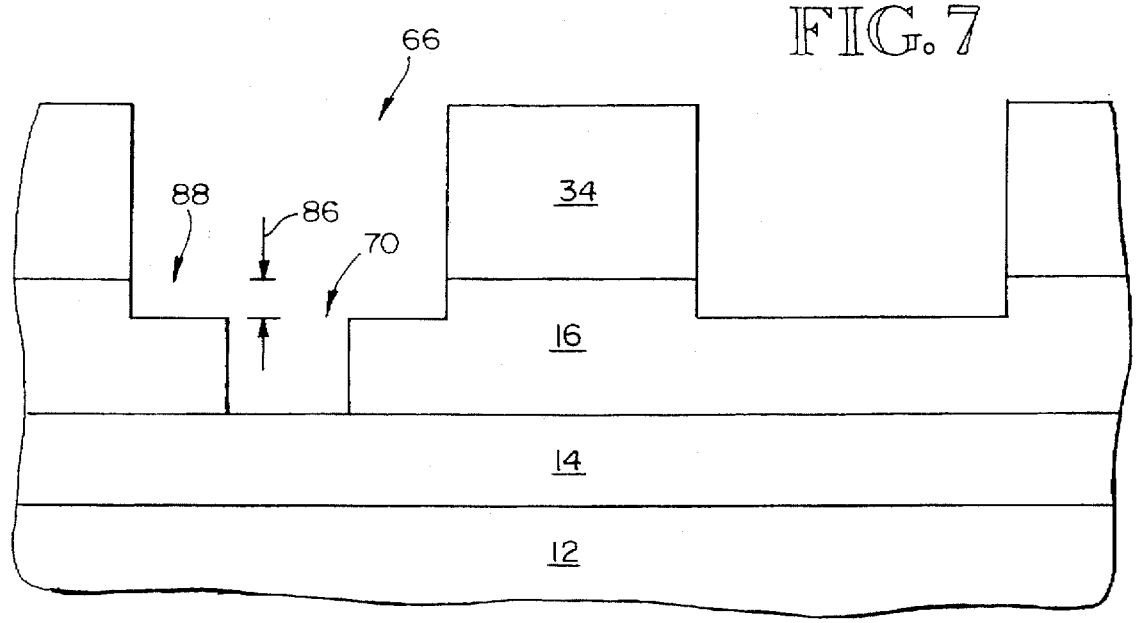
FIG. 7 is a cutaway view of the semiconductor wafer of FIG. 6 after a trench etching step is performed according to an embodiment of this invention.

Referring to FIGS. 2 and 6, at step 80 a resist etch is performed to remove any remaining photoresist within the first opening 66. Thus, an additional portion of the upper surface 82 of the insulating layer 16 is exposed. At step 84 a trench etch is performed (see FIG. 7) within the openings 66 and 70 to remove insulating material. Within opening 70, insulating material is etched away down to the first layer 14. Within the remaining portion of the opening 66 insulating material is removed down to a depth 86. Such depth 86 is less than the depth 74 (occurring during at step 72). In the embodiment illustrated the result is a T opening 88 (when viewed cross-sectionally) in the insulating layer 16. The specific shape of the opening is defined according to the relative geometry of the first and second areas 44, 46 receiving the differing dosages D1, D2 along with the desired etching geometry through the photoresist layer 34 and insulating layer 16.

Referring to FIG. 2, at step 89 resist stripping is performed to remove any remaining resist 34. Exemplary resist stripping processes include dry or wet etching processes.

Figure 8:
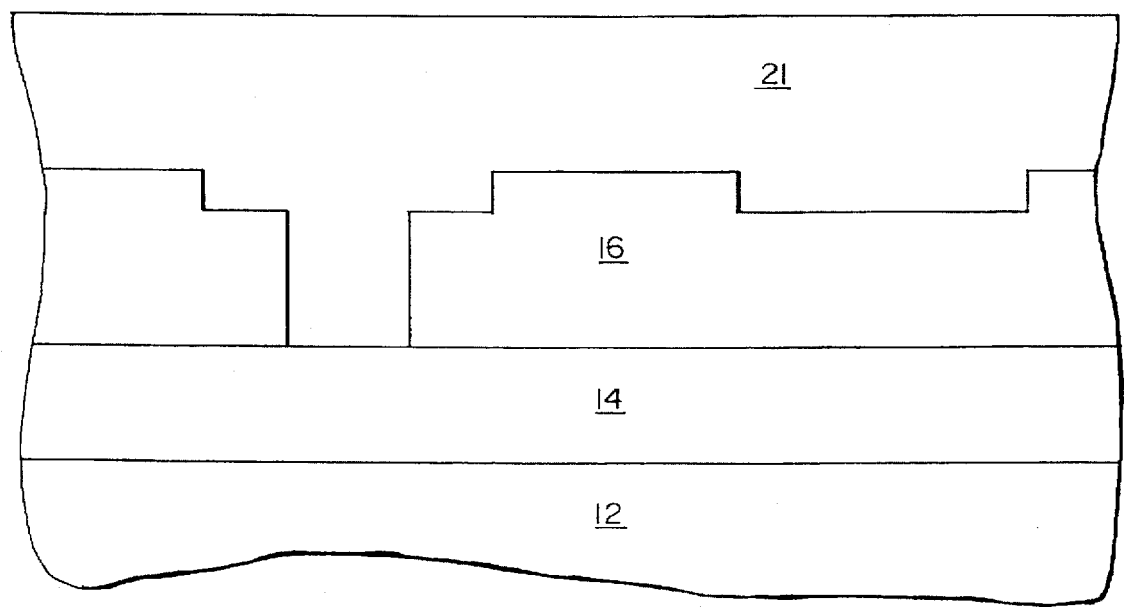
FIG. 8 is a cutaway view of the semiconductor wafer of FIG. 7 after a resist stripping step and a conductive material deposition step is performed according to an embodiment of this invention.
Figure 9:
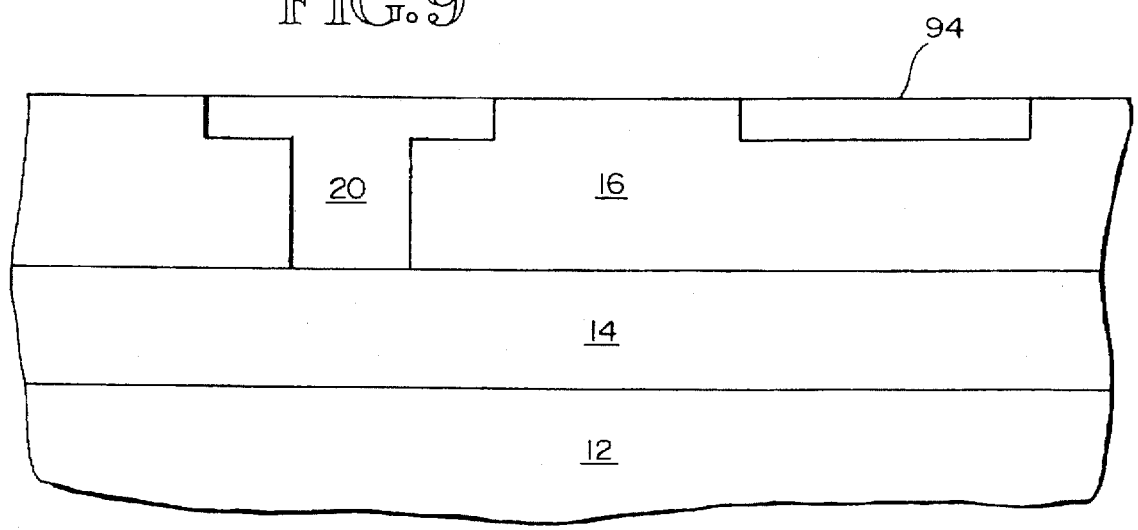
FIG. 9 is a cutaway view of the semiconductor wafer of FIG. 8 after a dry etch or CMP step is performed according to an embodiment of this invention.

Referring to FIGS. 2 and 8 at step 90 conductive material 21 is deposited upon the wafer 10. In particular the conductive material is deposited into the opening 88 and upon the surrounding insulating layer 16. At step 92 either one of a dry etch of CMP process is performed to remove excess conductive material 21. The dry etch or CMP leaves the conductive material 21 within the opening 88 and removes other conductive material to generate a smooth surface exposing the insulating layer 16 and upper conductive layer 18 (See FIG. 9).

Note that a single photolithographic process (steps 36, 38) is used in forming the contact 20 and upper layer 18. This is achieved by using differing dosages of light and developing the expose regions to different depths. Subsequent etching steps then define openings to different depths for the contact 20 and upper conductive layer 18. In contrast, according to a conventional fabrication process a contact is formed, then an upper conductive layer is formed. Specifically, photoresist resist is applied, exposed and developed to form an opening in the resist. Then contact etching, resist stripping, metal deposition and CMP or dry etching or performed to define the contact. Subsequently, photoresist is applied again, exposed and developed to form an opening. Trench etching, resist stripping, metal deposition and CMP or dry etching are performed to define the upper conductive layer. Accordingly, the method of this invention reduces the number of photolithographic processes.

Mask

Referring again to FIG. 3, the mask 42 has regions of different transmissivity. In one embodiment the mask is a phase-shifting mask. The mask 42 is formed by a mask plate 48 which is patterned by well known methods in the semiconductor art to obtain masking features. Many different masking patterns including, lines, rectangles, circles or other geometric shapes are formed. The mask plate 48 is formed of a material which is generally transparent at a given illuminating frequency. For example a quartz mask plate 48 is transparent to light in the visible or ultraviolet range. Other materials with a narrower transmissive frequency range such as soda glass are used in other embodiments. Regions 58 of the mask 42 in which light travels only through the mask plate 48 have a first transmissivity at the light wavelength used in the photolithographic process.

To define mask regions 56 having a second transmissivity at the photolithographic process wavelength, a semi-transmissive material layer 50 is deposited on desired regions of the mask plate 48. The second transmissivity is less than the first transmissivity. Preferably, the second transmissivity is 5% to 95% times that of the first transmissivity. The relative transmissivity varies depending on the desired depth differential to be formed in the resist layer 34. Layer 50 is formed by depositing a semi-transmissive material onto the mask plate 48. An exemplary semitransmissive material is a chromium-oxide material available through Toppan Printing Co., Ltd of Tokyo Japan. Other semi-transmissive materials include molybdenum-oxide, iron oxide, silicon nitride, and aluminum.

The mask 42 also defines regions 60 having a third transmissivity where resist is not to be exposed. Ideally such transmissivity is 0% relative to the first transmissivity. In preferred embodiments, the third transmissivity is 0.1% or less relative to the first transmissivity. In one embodiment mask regions 60 are formed by depositing another layer 52 of semitransmissive material onto portions of the layer 50. Such additional semitransmissive material is either the same, although preferably different, than the material deposited to form layer 50. In an exemplary embodiment, layer 50 is formed by a chromium-oxide based material (e.g., chrome, oxygen, fluorine and nitrogen elements), while layer 52 is formed by a molybdenum-oxide based material (e.g., molybdenum, silicon oxygen and nitrogen). The specific transmissivities of layer 50 and layer 52 are determined by the respective layer thicknesses and layer compositions. Increasing the proportion of chromium or molybdenum, for example, decreases transmissivity. In an alternative embodiment, region 60 is formed by depositing an opaque material directly onto the mask plate 48 at the desired regions. In one embodiment the opaque material is similar to the semi-transmissive material, but includes a higher proportion of chromium, molybdenum or another transmissivity-decreasing element. The layout and various transmissive characteristics of the materials 48, 50, 52 define the mask pattern.

In some embodiment a phase-shifting material is applied as an additional layer (not shown). Preferably, however, the layers 50, 52 include a material composition for achieving a desired degree of phase-shifting. An exemplary phase-shifting material is $Si_3N_4$, although other materials such as oxides or oxynitrides also may be used. The function of the phase-shifting material is to alter the timing or shift the waveform of light waves propagating through mask plate 48 and adjacent semi-transmissive material 50. Materials of different thickness or different indices of refraction serve to shift the phase of the light waves. Phase-shifting masks reduce diffraction effects of the propagating light waves by combining diffracted and phase-shifted light. The degree of phase-shifting preferred, if any, depends on the pattern sizes to be formed in the resist.

As the desired pattern decreases, conventional photolithographic processes often use 180 degree phase shifting to achieve precisely defined patterns. Such a phase difference, however, typically results in a small region of very low transmissivity at the boundary on the resist between where light of one phase impinges and light of the other phase impinges. In applications of this invention where a first resist region 44 receiving light at a first dosage is adjacent to a second region receiving light at a second dosage, it is undesirable to leave a thin boundary of resist between these adjacent regions 44, 46. Accordingly, it is preferable to use less than 180 degree phase shifting when developing, during one step, adjacent areas of resist to different depths. For pattern sizes where light diffraction is not a problem, zero phase-shifting is used. As the pattern size decreases and correspondingly the need for phase-shifting increases, the degree of phase-shifting implemented is increased. For small pattern sizes in which light diffraction poses a difficulty, phase-shifting is needed. In such instances the preferred amount of phase-shifting is the highest degree possible without leaving a thin barrier between adjacent regions 44, 46. Such degree varies depending on the desired pattern size, the coherence of the light impinging on the resist layer 34, and the respective depths of adjacent areas 44, 46, (e.g., depths 62 in FIG. 4).

Meritorious and Advantageous Effects

One advantage of the invention is to reduce the number of photolithographic steps in a semiconductor fabrication process without compromising device efficiency or effectiveness. Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A method for partially developing a layer of photoresist on a semiconductor wafer, comprising the steps of:

exposing a first area of the photoresist layer to light having a first dosage while concurrently exposing a second area to light having a second dosage differing from the first dosage; and concurrently developing the first area and second area of the photoresist layer to remove photoresist within the first area to one depth and to remove photoresist within the second area to a second depth, the second depth differing from the first depth.

2. The method of claim 1 in which the step of exposing is performed using a mask having a region of first transmissivity and a region of second transmissivity, and in which light exiting the mask at the region of first transmissivity is of the first dosage for exposing the first area, and in which light exiting the mask at the region of second transmissivity is of the second dosage for exposing the second area.

3. The method of claim 1 in which the first area and second area are adjacent.

4. A method for connecting a first layer and a second layer of a semiconductor wafer, the second layer being above the first layer for at least a portion of the first layer and at least a portion of the second layer, the second layer comprising a conductive material, the method comprising the steps of:

applying a layer of photoresist onto an insulating layer of a semiconductor wafer, the semiconductor wafer comprising a first layer and the insulating layer, the insulating layer covering the first layer;

exposing a first area of the photoresist layer to light having a first dosage while concurrently exposing a second area adjacent the first area to light having a second dosage differing from the first dosage;

concurrently developing the first area and second area of the photoresist layer to remove photoresist within the first area to one depth so as to define a first opening in the photoresist layer and to remove all the photoresist within the second area so as to define a second opening in the photoresist layer exposing a portion of the insulating layer;

etching the exposed insulating layer to extend the second opening into the insulating layer; and depositing a conductive material into the extended second opening.

5. The method of claim 4 in which the step of etching comprises the steps:

etching the exposed insulating layer within the second opening to a first depth; and etching through the photoresist remaining in the first area and an underlying portion of the insulating layer down to a second depth in the insulating layer, wherein the first depth is greater than the second depth.

6. The method of claim 4 in which the step of etching comprises the steps:

etching the exposed insulating layer within the second opening to a first depth to extend the second opening, wherein the first depth is less than thickness of the insulating layer;

etching through the insulating layer in the first area down to a second depth in the insulating layer, wherein the first depth is greater than the second depth; and etching the insulating layer within the extended second opening through to the first layer.

7. The method of claim 6 in which the first layer comprises a conductive material.

8. The method of claim 6 in which the first layer comprises a semiconductive material.

9. A method for forming a contact and upper conductive layer coupled to a first layer of a semiconductor wafer, the upper conductive layer being above the first layer for at least a portion of the first layer and at least a portion of the upper conductive layer, the method comprising the steps of:

applying a layer of photoresist onto an insulating layer of a semiconductor wafer, the semiconductor wafer comprising a first layer and the insulating layer, the insulating layer covering the first layer;

exposing a first area of the photoresist layer to light having a first dosage while concurrently exposing a second area adjacent the first area to light having a second dosage differing from the first dosage;

concurrently developing the first area and second area of the photoresist layer to remove photoresist within the first area to one depth so as to define a first opening in the photoresist layer and to remove all the photoresist within the second area so as to define a second opening in the photoresist layer exposing a portion of the insulating layer;

etching the exposed insulating layer to extend the second opening into the insulating layer; and depositing a conductive material into the extended second opening, wherein the deposited conductive material defines the contact and the upper conductive layer.

10. The method of claim 9 in which the step of etching comprises the steps:

etching the exposed insulating layer within the second opening to a first depth; and etching through the photoresist remaining in the first area and an underlying portion of the insulating layer down to a second depth in the insulating layer, wherein the first depth is greater than the second depth.

11. The method of claim 9 in which the step of etching comprises the steps:

etching the exposed insulating layer within the second opening to a first depth to extend the second opening, wherein the first depth is less than thickness of the insulating layer;

etching through the insulating layer in the first area down to a second depth in the insulating layer, wherein the first depth is greater than the second depth; and etching the insulating layer within the extended second opening through to the first layer.

* * * * *

UNITED STATES PATENT AND TRADEMARK OFFICE
CERTIFICATE OF CORRECTION

PATENT NO. : 5,741,624
DATED : April 21, 1998
INVENTOR(S) : Jeng et al.

Page 1 of 1

It is certified that error appears in the above-identified patent and that said Letters Patent is hereby corrected as shown below:

Column 1,
Line 6, before "Background of the Invention", please insert the following paragraph heading and paragraph:

GOVERNMENT RIGHTS

This invention was made with the United States Government support under contract No. MDA972-92-C-0054 awarded by the Advanced Research Projects Agency (ARPA). The United States Government has certain rights in this invention.

Signed and Sealed this

Twenty-eighth Day of August, 2001

*Attest:*

NICHOLAS P. GODICI
*Attesting Officer*     *Acting Director of the United States Patent and Trademark Office*